United States Patent [19]

Fung et al.

[11] Patent Number: 5,107,465
[45] Date of Patent: Apr. 21, 1992

[54] ASYNCHRONOUS/SYNCHRONOUS PIPELINE DUAL MODE MEMORY ACCESS CIRCUIT AND METHOD

[75] Inventors: Jimmy Fung, Cupertino; Jiu An, San Jose; David L. Campbell, Sunnyvale; Steven Shyu, Cupertino, all of Calif.

[73] Assignee: Advanced Micro Devices, Inc., Sunnyvale, Calif.

[21] Appl. No.: 407,403

[22] Filed: Sep. 13, 1989

[51] Int. Cl.$^5$ .................. G11C 8/00; G11C 11/418
[52] U.S. Cl. .................. 365/230.08; 365/230.06; 365/233
[58] Field of Search ............ 365/230.06, 230.08, 365/233

[56] References Cited

U.S. PATENT DOCUMENTS

| 4,415,994 | 11/1983 | Ive et al. | 365/230.08 |
| 4,750,839 | 7/1988 | Wang et al. | 365/230.08 |
| 4,849,935 | 7/1989 | Miyazawa | 365/189.05 |
| 4,912,679 | 3/1990 | Shinoda et al. | 365/233 |

*Primary Examiner*—Glenn Gossage
*Attorney, Agent, or Firm*—Fliesler, Dubb, Meyer & Lovejoy

[57] ABSTRACT

A pipeline memory access circuit has a memory address buffer for buffering memory addresses. The buffer has a first and a second pass gate, and each of the pass gates has a pair of complementary metal-oxide-semiconductor (CMOS) transistors. An apparatus is provided for selectively switching the buffer between an asynchronous and a synchronous mode of operation. The switching apparatus includes circuits for alternately opening and closing the first and second pass gates when the buffer is in its synchronous mode of operation and for simultaneously opening both of the pass gates when the buffer is in its asynchronous mode of operation.

10 Claims, 2 Drawing Sheets

ASYNCHRONOUS/SYNCHRONOUS PIPELINE DUAL MODE MEMORY ACCESS CIRCUIT AND METHOD

BACKGROUND OF THE INVENTION

1. Field of the Invention

The present invention relates to data storage access circuits in high-speed CMOS pipeline architecture in general and in particular to a method and apparatus comprising a CMOS pipeline buffer with means for selectively switching the buffer between asynchronous and synchronous modes of operation for use in both low and high powered applications of such architecture.

2. Description of the Prior Art

Conventional high speed pipeline memory access circuits such as used in desk top video graphics systems, color palettes, and the like, require complementary synchronized clocks to control the gates of the internal flip-flops used to latch decoded addresses for addressing memory cells, storage registers or other data storage devices used therein. Such circuits, which typically have clock rates in excess of 80 mHz, i.e. periods of less than 12 nsec., will not provide memory or register access while the clock is disabled. This limitation in the prior known circuits generally prevents their use in low power applications and in particular has prevented low power asynchronous accessing of memory circuits in such low power applications by external devices.

SUMMARY OF THE INVENTION

In view of the foregoing, principal objects of the present invention are a method and apparatus comprising a high speed CMOS pipeline memory address buffer with means for selectively switching between asynchronous and synchronous operation of said buffer in an otherwise conventional high speed CMOS pipeline architecture.

As described above, prior art pipeline architecture does not allow either internal or external devices to access the data stored in a system memory or register without a clock running.

While high speed synchronous memory access is desirable, frequently lower speed asynchronous memory access without a clock is acceptable, particularly when conserving available power is important such as in battery powered lap top video graphics systems, color palettes and the like.

In accordance with the present invention, there is provided a high speed CMOS pipeline memory address buffer coupled to a circuit for stopping the clock and thereby conserving power while enabling asynchronous memory access in an otherwise conventional pipeline architecture. The conservation of power thus achieved extends the use of such architecture to low power applications, such as described above, while providing the economic advantage that the same circuit can be used in both high and low power applications.

A conventional CMOS memory access circuit, i.e. memory address buffer, used in pipeline architecture comprises a plurality of flip-flops, i.e. a master and a slave, each having at least a first and a second pass gate coupled to the address/select line of a memory cell or other storage device for buffering memory addresses. Each of the gates comprises a P-channel and an N-channel CMOS transistor. Heretofore, it has been the practice to alternately open and close these gates by using complementary clock signals to latch the address on the word/select line. The gates of these transistors are coupled to the complementary clock signal in such a manner that when the clock is low the first gate is open and the second gate is closed. Conversely, when the clock is high, the first gate is closed and the second gate is opened. In this manner, addresses are transferred via the master and slave flip-flops in the buffer to the storage device for addressing the device. It has been found, however, that by simultaneously holding both gates open, memory access is achieved even when the clock is disabled, thus allowing for low power asynchronous communications between internal memory devices and internal or external data sources and receivers whenever the need or opportunity arises.

A further advantage of the present invention is that only a few additional transistors are required to provide the necessary gate control signals, thus enabling the same chip to be used in both high and low power applications at reasonable cost.

BRIEF DESCRIPTION OF THE DRAWINGS

The above and other objects, features and advantages of the present invention will become apparent from the following detailed description of the accompanying drawings, in which.

DETAILED DESCRIPTION OF THE INVENTION

Figure 1:
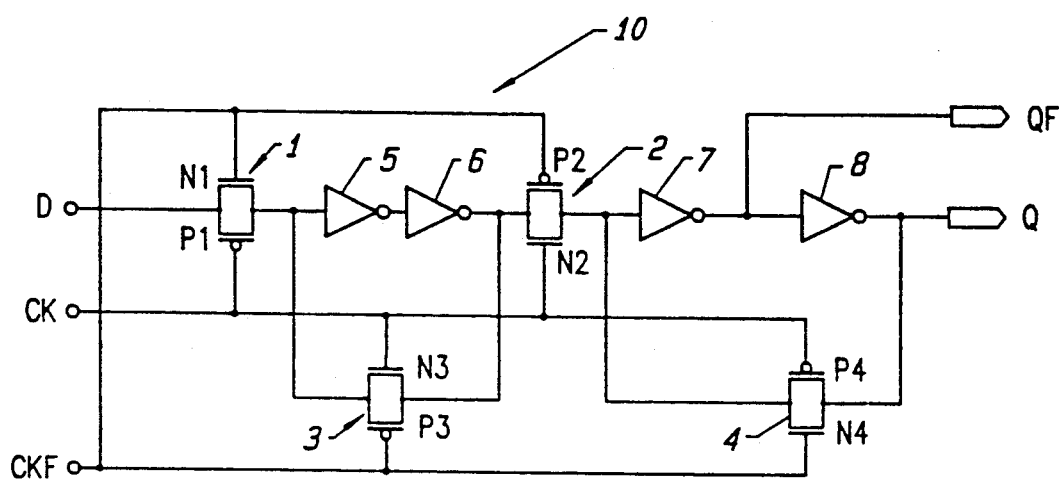
FIG. 1 is a block diagram of a pair of interconnected prior known high speed CMOS pipeline flip-flops.

Referring to FIG. 1, there is provided in a prior known high speed CMOS pipeline flip-flop circuit designated generally as 10 a plurality of pass gates 1, 2, 3 and 4 and a plurality of inverters 5, 6, 7 and 8. In each of the pass gates 1-4 there is provided an N-channel transistor designated by the letter N and a P-channel transistor designated by the letter P. For example, gate 1 comprises an N-channel transistor N1 and a P-channel transistor P1. A source of data is coupled to the gate 1 by means of an input line D. The output of gate 1 is coupled by means of inverters 5 and 6 to gate 2. The output of gate 2 is coupled through inverter 7 to an output line QF and through another inverter 8 to an output line Q. Output line Q provides an output signal Q corresponding to the data signal applied to the input line D. Output line QF provides the complement thereof. Gate 3 is coupled across inverters 5 and 6. Gate 4 is coupled across inverters 7 and 8. All of the gates are controlled by complementary control signals CK and CKF applied to control lines CK and CKF which are provided by true and complementary signal sources.

In operation, inverters 5 and 6 and pass gate 3 comprise a first flip-flop, i.e. the master, and inverters 7 and 8 and pass gate 4 comprise a second flip-flop, i.e. slave. For purposes of explanation, gates 1 and 4 will be opened, i.e. made conductive and gates 2 and 3 will be closed, i.e. made non-conductive, when clock signal CK is low. With gates 1 and 4 opened, the output Q is latched by means of the inverters 7 and 8 in the slave flip-flop and new data applied to the D input is fed to the inverters 5 and 6. When the signal CK goes high and the complementary signal CKF goes low, gates 1 and 4 are closed and gates 2 and 3 are opened. When gates 2 and 3 open, the signal on the output of the inverter 6 is latched in the master via the gate 3. At the same time, the output of inverter 6 is fed to the true and complementary outputs Q and QF at the output of inverters 8 and 7, respectively. This process is repeated for each change in the complementary control signals CK and CKF such that the true and complementary outputs Q and QF are synchronized with those clock signals.

In accordance with the present invention it was found that by switching the complementary control signals CK and CKF to non-complementary control signals, i.e. control signals having the same logical level either high or low, each of the gates 1-4 would have at least one of their N- or P-channel transistors made conductive such that the gates 1-4 are simultaneously forced to their open state. For example, with both CK and CKF high, the N-channel transistors N1-N4 in the gates 1-4 are made conductive Conversely, when CK and CKF are low, the P-channel transistors P1-P4 in the gates 1-4 are made conductive. In either case, the circuit 10 appears transparent to data applied to the D input of the circuit, i.e. data applied to the D input and the complement thereof appear on the Q and QF outputs, respectively, under either of the above-stated conditions for CK and CKF.

Figure 2:
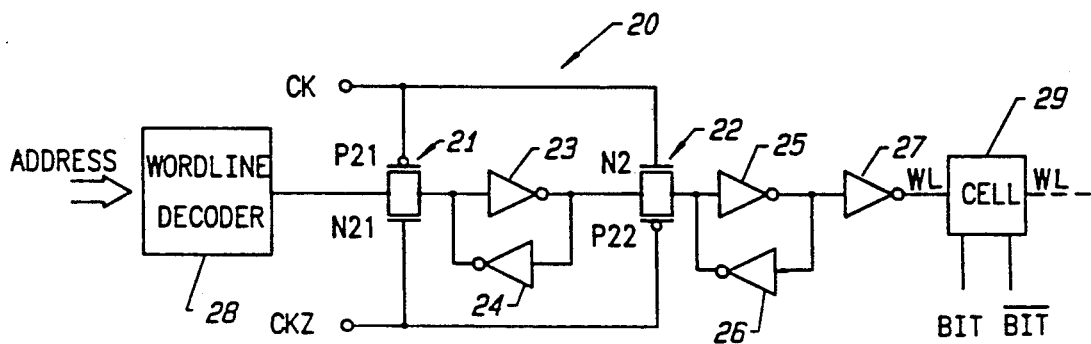
FIG. 2 is a memory address buffer according to the present invention.

Referring to FIG. 2, there is provided in accordance with the present invention a memory address buffer designated generally as 20. In the buffer 20 there is provided a first pass gate 21 comprising a P-and N-channel transistor P21, N21, a second gate 22 comprising a P-channel and N-channel transistor P22 and N22, and a plurality of inverters 23 and 24 comprising a first flip-flop, master, and a plurality of inverters 25 and 26 comprising a second flip-flop, slave. The output of the slave flip-flop is coupled to an inverter 27. The buffer 20 is shown coupled between an address/word-line decoder 28 and the word-line of a memory cell 29. Obviously, in any memory there will be a plurality of circuits 20 for each of the memory cells in the memory.

The operation of the gates 21 and 22 is controlled by the logical levels of the control signals CK and CKZ. As will be further described below, when CK and CKZ are complementary, one of the gates 21 and 22 is open, i.e. made conductive, while the other of the gates 21 and 22 is closed, i.e. made such that data input to gate 21 is latched into the latching circuits formed by the inverters 23, 24 and inverters 25, 26 in synchronism with changes in the level of the complementary signals.

Figure 3:
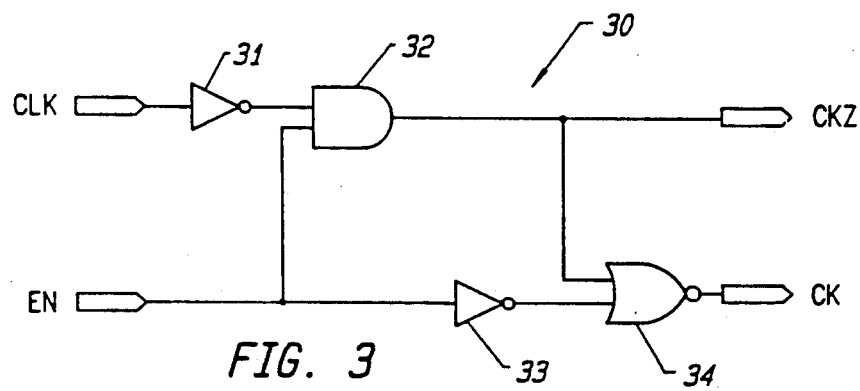
FIG. 3 is a control circuit for operating the apparatus of FIG. 2 according to the present invention.

Referring to FIG. 3, there is provided in accordance with the present invention a control circuit designated generally as 30 for generating the control circuits signals CK and CKZ. In the control circuit 30 there is provided an inverter 31, an AND gate 32, an inverter 33 and a NOR gate 34. The input of the inverter 31 is coupled to a source of clock signals CLK. The output of the inverter 31 is coupled to one input of the AND gate 32. A second input of the AND gate 32 is coupled to a source of an enable signal EN. The source of enable signal EN is also coupled to an input of the inverter 33. The outputs of the AND gate 32 and the inverter 33 are coupled to first and second inputs of the NOR gate 34. The output of the NOR gate 34 provides the control signal CK. The output of the AND gate 32 provides the control signal CKZ.

In operation, the buffer 20 can be switched between synchronous and asynchronous modes of operation by controlling the enable signal EN. When the enable signal EN is high, the output on inverter 33 is low enabling the NOR gate 34 to provide the complement of the signal applied to the other input thereof. When the clock signal CLK applied to the input of inverter 31 is high, the output of the AND gate 32 is low, providing a low output CKZ and a high output CK. Conversely, when the clock signal CLK applied to the input of the inverter 31 is low, the output of the AND gate 32 is high, providing a high output control signal CKZ and a low output control signal CK. Thus it will be seen that when EN is high, output control signals CK and CKZ are complementary clock signals and when applied to the gates 21 and 22 of circuit 20 of FIG. 2, provide synchronous control of the buffer 20, i.e. synchronous control of the gates 21 and 22.

To switch the buffer 20 to asynchronous operation, the enable signal EN is driven low. With EN low, the output of inverter 33 is high, disabling NOR gate 34 and causing its output to remain low regardless of the logical level on the second input thereof. Similarly, with enable signal EN low, AND gate 32 is disabled, providing a low level on the output thereof such that control signals CK and CKZ are simultaneously low when enable signal EN is low. Under these conditions, the P-channel transistors P21 and P22 are made conductive, rendering the buffer 20 transparent to address data provided by the word-line decoder 28 to the memory cell 29.

Figure 4:
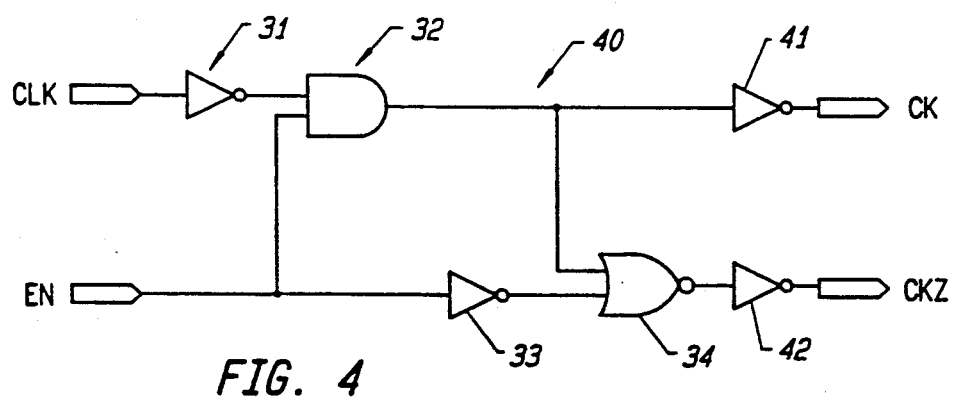
FIG. 4 is an alternative control circuit for operating the apparatus of FIG. 2 according to the present invention.

Referring to FIG. 4, there is shown in another embodiment of the present invention a control circuit designated generally as 40 which is identical to the control circuit 30 of FIG. 3, except that a pair of inverters 41 and 42 are provided on the output of the AND gate 32 and NOR gate 34, respectively, for inverting the outputs thereof. By inverting the outputs of the AND gate 32 and NOR gate 34 when the enable signal EN is low, the control signals CK and CKZ are forced high. When the control signals CK and CKZ are forced high, the N-channel transistors N21 and N22 of the gates 21 and 22 of the buffer 20 of FIG. 2 are made conductive instead of the P-channel transistors 21 and 22. As before, under these conditions, the buffer is rendered transparent to data being transferred from the word-line decoder 28 to the memory cell 29.

While a preferred embodiment of the present invention is described above, it is contemplated that various modifications may be made thereto without departing from the spirit and scope of the present invention. For example, various arrangements of logic circuits may be used for providing the signals CK and CKZ which are necessary for the dual modes of operation described herein. Accordingly, it is intended that the embodiment described be considered only as an illustration of the present invention and that the scope thereof should not be limited thereto but be determined by reference to the claims hereinafter provided.

What is claimed is:

1. An apparatus for selectively switching a memory address buffer in a pipeline memory access circuit between an asynchronous and a synchronous mode of operation is response to an enable control signal having a first and a second logical level, respectively, said buffer having a first and a second pass gate, each of said pass gates having a first and a second CMOS transistor, said apparatus comprising:

a first input for receiving clock signals;
a second input for receiving said enable control signal;
a first output coupled to the gate of the first transistor in each of said first and second pass gates;
a second output coupled to the gate of the second transistor in each of said first and second pass gates; and
means responsive to said clock signals on said first input and said enable control signal on said second input for providing complementary clock signals on said first and said second outputs, respectively, so as to make conductive the transistors in one of said first and second pass gates while making non-conductive the transistors in the other of said first and second pass gates when said enable control signal is at its first logical level, and a pass gate control signal having the same logical level on both said first and said second outputs for making conductive at least one transistor in each of said first and second pass gates when said enable control signal is at its second logical level.

2. An apparatus according to claim 1 wherein said means for providing said complementary clock signals and said pass gate control signal comprises:
a first inverter having an input coupled to said first input for receiving clock signals;
an AND gate having a first input coupled to an output of said first inverter and a second input coupled to said second input for receiving said enable signal;
a second inverter having an input coupled to said second input for receiving said enable signal; and
a NOR gate having a first input coupled to an output of said AND gate and a second input coupled to an output of said second inverter, said AND gate providing on an output thereof a first one of said complementary clock signals and said NOR gate providing on an output thereof a second one of said complementary clock signals when said enable signal is at its first logical level, and both said AND gate and said NOR gate providing on the outputs thereof said pass gate control signal having the same logical level when said enable signal is at its second logical level.

3. An apparatus according to claim 2 further comprising a pair of inverters having inputs respectively coupled to the outputs of said AND gate and said NOR gate for inverting the outputs of said gates.

4. A method of selectively switching a memory address buffer in a pipeline memory access circuit between an asynchronous and a synchronous mode of operation, said buffer having a first and a second pass gate, each of said pass gates having a pair of CMOS transistors, said method comprising the steps of:
providing on the gates of each pair of transistors in each of said pass gates complementary clock signals for making conductive the transistors in one of said pairs of gates while making non-conductive the transistors in the other of said pairs of gates when said buffer is in its synchronous mode of operation; and
providing on the gates of each pair of transistors in each of said pass gates a control signal having a predetermined logical level for simultaneously making conductive at least one transistor in each of said pairs of transistors when said buffer is in its asynchronous mode of operation.

5. A method according to claim 4 wherein said step of providing said complementary clock signals comprises providing, in response to a clock signal and an enable signal having a first and a second logical level, said complementary clock signals when said enable signal is at its first logical level, and said step of providing said control signal comprises providing said control signal having said predetermined logical level when said enable signal is at its second logical level.

6. A method according to claim 5 wherein said predetermined logical level of said control signal is selected from one of a logical low level of a logical high level.

7. An apparatus for selectively switching a memory address buffer in a pipeline memory access circuit between an asynchronous an da synchronous mode of operation, said buffer having a first and a second pass gate, each of said pass gates having a pair of CMOS transistors, said apparatus comprising:
means for providing on the gates of each pair of transistors in each of said pass gates complementary clock signals for making conductive the transistors in one of said pairs of gates while making non-conductive the transistors in the other of said pairs of gates when said buffer is in its synchronous mode of operation and for simultaneously providing on the gates of each pair of transistors in each of said pass gates a control signal having a predetermined logical level for simultaneously making conductive at least one transistor in each of said pass gates when said buffer is in its asynchronous mode of operation, said means for providing including:
a first inverter having an input coupled to a source of clock signals;
an AND gate having a first input coupled to an output of said first inverter and a second input coupled to a source of an enable signal having a first and a second logical level;
a second inverter having an input coupled to said source of said enable signal; and
a NOR gate having a first input coupled to an output of said AND gate and a second input coupled to an output of said second inverter, said AND gate providing on said output thereof a first one of said complementary clock signals and said NOR gate providing on an output thereof a second one of said complementary clock signals when said enable signal is at its first logical level, and both said AND gate and said NOR gate providing on the outputs thereof said control signal having said predetermined logical level when said enable signal is at its second logical level.

8. An apparatus according to claim 7 further comprising a pair of inverters having inputs respectively coupled to the outputs of said AND gate and said NOR gate for inverting the outputs of said gates.

9. A method of selectively switching a memory address buffer in a pipeline memory access circuit between an asynchronous and a synchronous mode of operation, said buffer having a first and a second pass gate, each of said pass gates having a pair of CMOS transistors, said method comprising the steps of:
providing on the gates of each pair of transistors in each of said pass gates complementary clock signals for making conductive the transistors in one of said pairs of gates while making non-conductive the transistors in the other of said pairs of gates when said buffer is in its synchronous mode of operation; and providing on the gates of each pair of transistors in each of said pass gates a control signal having a predetermined logical level for simultaneously making conductive at least one transistor in each of said pairs of transistors when said buffer is in its asynchronous mode of operation, wherein said step of providing said complementary clock signals and said step of providing said control signal collectively comprise the steps of:

providing a first inverter having an input coupled to a source of clock signals;

providing an AND gate having a first input coupled to an output of said first inverter and a second input coupled to a source of an enable signal having a first and a second logical level;

providing a second inverter having an input coupled to said source of said enable signal; and providing a NOR gate having a first input coupled to an output of said AND gate and a second input coupled to an output of said second inverter, said AND gate providing on said output thereof a first one of said complementary clock signals and said NOR gate providing on an output thereof a second one of said complementary clock signals when said enable signal is at its first logical level, and both said AND gate and said NOR gate providing on said outputs thereof said control signal having said predetermined logical level when said enable signal is at its second logical level.

10. A method according to claim 9 further comprising a step of providing a pair of inverters having inputs respectively coupled to the outputs of said AND gate and said NOR gate for inverting the outputs of said gates.

* * * * *